(12) United States Patent
Rinker

(10) Patent No.: US 8,084,522 B2
(45) Date of Patent: Dec. 27, 2011

(54) THERMALLY STABLE CATIONIC PHOTOCURABLE COMPOSITIONS

(75) Inventor: Karsten Rinker, Rheine (DE)

(73) Assignee: BASF SE, Ludwigshafen (DE)

( * ) Notice: Subject to any disclaimer, the term of this patent is extended or adjusted under 35 U.S.C. 154(b) by 270 days.

(21) Appl. No.: 12/445,756

(22) PCT Filed: Oct. 15, 2007

(86) PCT No.: PCT/EP2007/060924
§ 371 (c)(1),
(2), (4) Date: Apr. 16, 2009

(87) PCT Pub. No.: WO2008/049743
PCT Pub. Date: May 2, 2008

(65) Prior Publication Data
US 2010/0304284 A1    Dec. 2, 2010

(30) Foreign Application Priority Data
Oct. 24, 2006  (EP) .................................... 06122783

(51) Int. Cl.
*C08K 5/3477*    (2006.01)

(52) U.S. Cl. .......... 524/99; 524/117; 524/128; 524/147; 524/153; 524/342; 524/351; 524/450

(58) Field of Classification Search .................... 524/99, 524/117, 128, 147, 153, 342, 351, 450
See application file for complete search history.

(56) References Cited

U.S. PATENT DOCUMENTS

| | | |
|---|---|---|
| 5,973,020 A | 10/1999 | Kerr et al. |
| 6,040,398 A | 3/2000 | Kinsho et al. |
| 6,235,807 B1 | 5/2001 | Misev |
| 6,306,555 B1 | 10/2001 | Schulz et al. |
| 6,407,146 B1 | 6/2002 | Fujita et al. |
| 6,420,450 B1 * | 7/2002 | Dengler et al. .................. 522/13 |
| 2004/0242901 A1 | 12/2004 | Norcini et al. |
| 2005/0165141 A1 * | 7/2005 | Wolf et al. ....................... 524/99 |
| 2005/0176969 A1 | 8/2005 | Herlihy et al. |
| 2006/0223903 A1 | 10/2006 | Cao et al. |
| 2007/0225395 A1 | 9/2007 | Wolf et al. |

FOREIGN PATENT DOCUMENTS

| | | |
|---|---|---|
| EP | 1000980 A1 | 5/2000 |
| EP | 1731544 A1 | 12/2006 |
| GB | 2198736 A | 6/1988 |
| WO | 9802493 A1 | 1/1998 |
| WO | 9935188 A1 | 7/1999 |
| WO | 03008404 A2 | 1/2003 |
| WO | 03072567 A1 | 9/2003 |
| WO | 2005070989 A2 | 8/2005 |

OTHER PUBLICATIONS

Copending U.S. Appl. No. 11/922,444, filed Dec. 27, 2007.
Copending U.S. Appl. No. 12/226,116, filed Oct. 8, 2008.

* cited by examiner

*Primary Examiner* — Peter Szekely
(74) *Attorney, Agent, or Firm* — Qi Zhuo

(57) ABSTRACT

The invention relates to a cationic photocurable composition comprising at least one cationically polymerizable compound, at least one onium salt photoinitiator, at least a moisture scavenger, and at least a stabilizer selected from the group consisting of sterically hindered nitroxyl stabilizers, sterically hindered phenolic antioxidants, organic phosphorous stabilizers and mixtures thereof.

15 Claims, No Drawings

THERMALLY STABLE CATIONIC PHOTOCURABLE COMPOSITIONS

The present invention relates to thermally stable photocurable compositions comprising cationic photoinitiators stabilized by a moisture scavenger, as well as to a cationic photoinitiator stabilized by a moisture scavenger.

Cationically curable compositions, comprising corresponding photoinitiator compounds are known in the art. Sulfonium salts as photoinitiators are for example described in WO 03/008404 and WO 03/072567, while for example WO 98/02493 and U.S. Pat. No. 6,306,555 disclose iodonium salt photoinitiator compounds.

Cationic systems, or photocurable compositions comprising cationic photoinitiators, are known of having insufficient storage stability. In particular, epoxy resins containing iodonium salt cationic photoinitiators exhibit a poor shelf life stability (dark stability). Traditionally, Lewis bases are employed to enhance the shelf life of these systems, but this approach inhibits the photocure response.

A stabilized cationic photoinitiator system comprising amines is for example suggested in WO 99/35188, while GB 2198736 discloses nitroxyl compounds as stabilizers in radically polymerizable formulations.

Strategies for improving the shelf life stability of photocurable compositions comprising cationic photoinitiators have for example been described in WO 05/070989. Disclosed are cationic photocurable compositions with improved shelf life stability comprising at least one cationically polymerizable compound, at least one onium salt photoinitiator and at least one compound selected from the group consisting of organic phosphorus stabilizers and hindered nitroxyl stabilizers.

It has now been found that moisture scavengers such as e.g. high porous crystalline aluminum silicates (zeolites) or triethylorthoformate provide an outstanding shelf life stability of photocurable cationic systems or of cationic photoinitiators without having an inhibiting effect on the cure speed. Normally it is expected that a zeolite addition slows down the cure speed because of the basicity of the zeolite.

Accordingly, the invention relates to a cationic photocurable composition comprising
at least one cationically polymerizable compound,
at least one onium salt photoinitiator,
at least a moisture scavenger, and
at least a stabilizer selected from the group consisting of hindered nitroxyl stabilizers, sterically hindered phenolic antioxidants, organic phosphorous stabilizers and mixtures thereof.

Moisture scavengers are for example molecular sieves or zeolites, especially in their activated substantially water free form. The zeolites are commercially available for example from UOP. One example of a suitable zeolite is Baylith L powder. Furthermore GRACE Davison zeolite molecular sieves sold as SYLOSIV® powder products are very suitable. Suitable moisture scavengers further are orthoesters like triethylorthoformate (TEOF). TEOF is commercially available from Borchers.

Preferred moisture scavengers are zeolites.

The zeolites are high porous aluminum silicates and may be defined as an aluminosilicate with a framework structure enclosing cavities occupied by large icons and water molecules, both of which have considerable freedom of movement, permitting ion exchange and reversible dehydration. The framework consists of an open arrangement of corner-sharing tetrahedra where $SiO_4$ are partially replaced by $AlO_4$ tetrahedra, which requires sufficient cations to achieve electroneutrality. An idealized formula is $M_{n+x/n}[(AlO_2)(SiO_2)_y]$ $mH_2O$ The molecular ratio of $SiO_2$ and $Al_2O_3$ is an important parameter for the properties of the compound such as temperature- and acid resistance. The selective properties of the internal surfaces changes from polar/hydrophilic behaviour based on the enriched aluminum content to non-polar/hydrophobic based on depleted aluminum content.

Accordingly, the invention relates to a composition as described above, wherein the moisture scavenger is an activated substantially water free zeolite or triethylorthoformate.

The cationically polymerizable compound is for example as defined in WO 05/070989, the disclosure of which is hereby incorporated by reference. As disclosed therein the present cationically polymerizable compounds are those which can be cationically polymerized using alkyl- or aryl-containing cations or protons. Typical examples are cyclic ethers, for instance epoxides, as well as vinyl ether and hydroxyl-containing compounds.

The type of epoxide resin is not critical. By epoxide resin is meant any molecule containing more than one 1,2 epoxide group which is capable of being converted by curing to a useful resin. The epoxide resin may contain the 1,2 epoxide group either internally, terminally, or on a cyclic structure.

The cationically polymerizable compounds used in the composition of the present invention are for example cycloaliphatic epoxy compounds, glycidyl ethers, oxetane compounds, vinyl ethers, acid-crosslinkable melamine resins, acid-crosslinkable hydroxymethylene compounds and acid-crosslinkable alkoxy-methylene compounds. The present cationically polymerizable compounds include hybrid systems based on mixtures of epoxy compounds and acrylates such as epoxy acrylates, polyester acrylates, polyurethane acrylates, polyether acrylates which are well known in UV-curing applications.

Examples of suitable organic phosphorus stabilizers are those as disclosed in WO 05/070989 or as disclosed for example in U.S. Pat. No. 6,444,733 the disclosure of which is hereby incorporated by reference. Organic phosphorus stabilizers are known and many compounds of this kind are commercially available.

Specific examples of organic phosphorus stabilizers are triphenyl phosphite, diphenyl alkyl phosphites, phenyl dialkyl phosphites, tris(nonylphenyl) phosphite, trilauryl phosphite, trioctadecyl phosphite, distearyl pentaerythritol diphosphite, tris(2,4-di-tert-butylphenyl) phosphite, diisodecyl pentaerythritol diphosphite, bis(2,4-di-tert-butylphenyl) pentaerythritol diphosphite(D), bis(2,6-di-tert-butyl-4-methylphenyl) pentaerythritol diphosphite (E), bisisodecyloxy-pentaerythritol diphosphite, bis(2,4-di-tert-butyl-6-methylphenyl) pentaerythritol diphosphite, bis(2,4,6-tri-tert-butylphenyl) pentaerythritol diphosphite, tristearyl sorbitol triphosphite, tetrakis (2,4-di-tert-butylphenyl) 4,4'-biphenylene-diphosphonite (H), 6-isooctyl-oxy-2,4,8,10-tetra-tert-butyl-dibenzo[d,f][1,3,2]dioxaphosphepin (C), 6-fluoro-2,4,8,10-tetra-tert-butyl-12-methyl-dibenzo[d,g][1,3,2]dioxaphosphocin (A), bis(2,4-di-tert-butyl-6-methyl-phenyl) methyl phosphite or bis(2,4-di-tert-butyl-6-methylphenyl) ethyl phosphite (G). The organic phosphorus stabilizers are for example tris(2,4-di-tert-butylphenyl) phosphite, tris(nonylphenyl) phosphite,

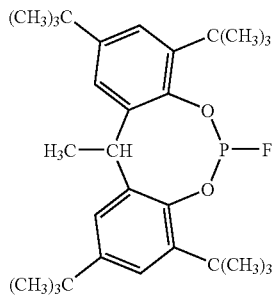 (A)
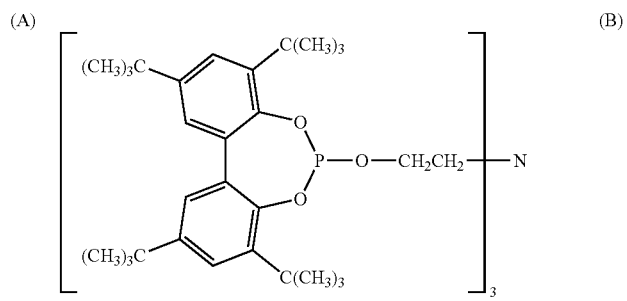 (B)
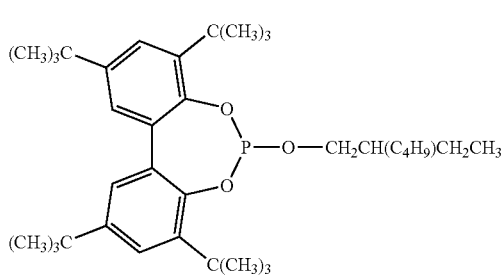 (C)
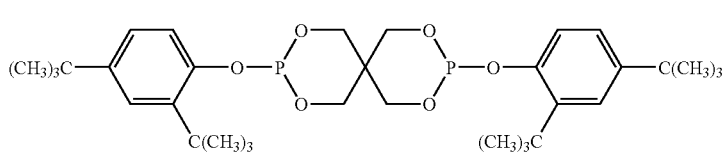 (D)
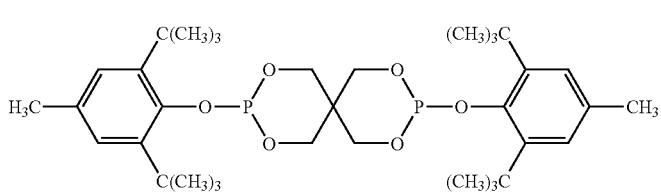 (E)
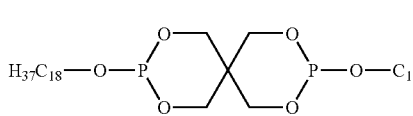 (F)
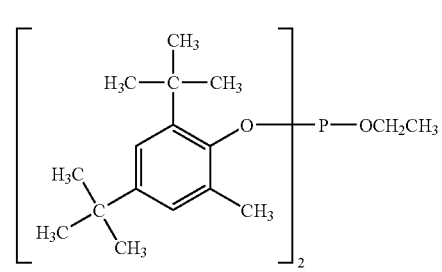 (G)
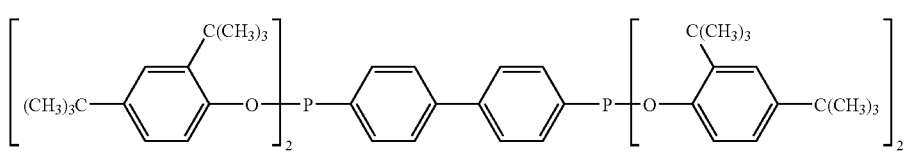 (H)
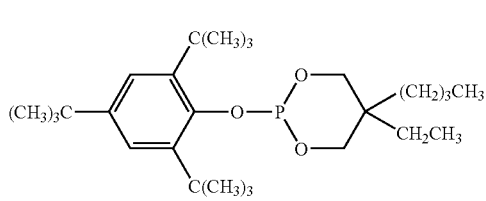 (J)
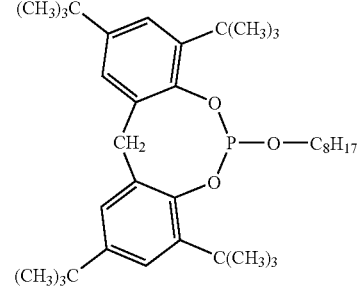 (L)

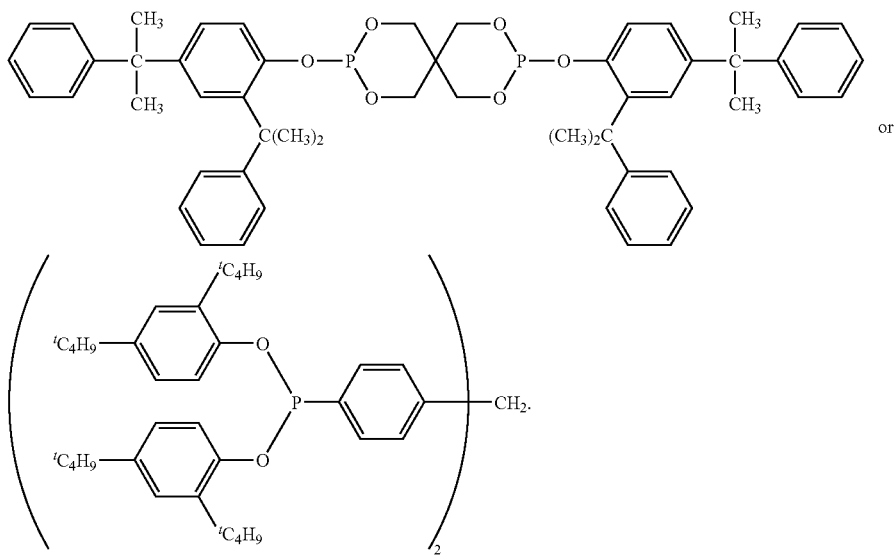

The organic phosphorus stabilizers are for example tris(2,4-di-tert-butylphenyl) phosphite, bis(2,4-di-tert-butyl-6-methylphenyl)ethyl phosphite (G), bis(2,4-di-tert-butylphenyl) penta-erythritol diphosphite (D), tetrakis(2,4-di-tert-butylphenyl)-4,4'-biphenylene-diphosphonite (H), 2,2',2"-nitrilo[triethyltris(3,3'5,5'-tetra-tert-butyl-1,1'-biphenyl-2,2'-diyl)phosphite] (B), compound (J), compound (K) or compound (L).

Specific preferred examples are:

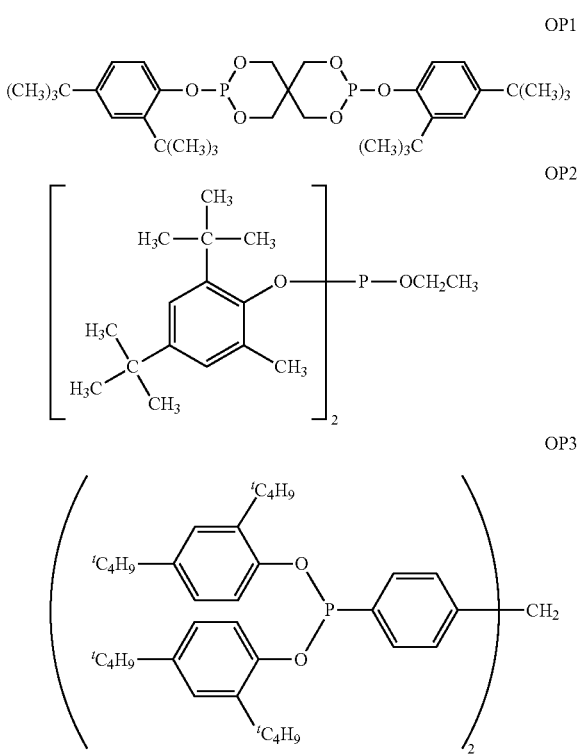

Hindered nitroxyl stabilizers, or hindered nitroxides are well known in the art and are disclosed for example in WO 05/070989, U.S. Pat. No. 6,337,426 or in U.S. Pat. No. 5,254,760, the relevant disclosures of which are hereby incorporated by reference.

Typical nitroxyl stabilizers include bis(1-oxyl-2,2,6,6-tetramethylpiperidin-4-yl) sebacate, 4-hydroxy-1-oxyl-2,2,6,6-tetramethylpiperidine, 4-ethoxy-1-oxyl-2,2,6,6-tetramethylpiperidine, 4-propoxy-1-oxyl-2,2,6,6-tetramethylpiperidine, 4-acetamido-1-oxyl-2,2,6,6-tetramethylpiperl-dine, 1-oxyl-2,2,6,6-tetramethylpiperidine, 1-oxyl-2,2,6,6-tetramethylpiperidin-4-one, 1-oxyl-2,2,6,6-tetramethylpiperidin-4-yl acetate, 1-oxyl-2,2,6,6-tetramethylpiperidin-4-yl 2-ethyl-hexanoate, 1-oxyl-2,2,6,6-tetramethylpiperidin-4-yl stearate, 1-oxyl-2,2,6,6-tetramethylpiperidin-4-yl benzoate, 1-oxyl-2,2,6,6-tetramethylpiperidin-4-yl 4-t-butyl-benzoate, bis(1-oxyl-2,2,6,6-tetramethylpiperidin-4-yl) succinate, bis(1-oxyl-2,2,6,6-tetramethylpiperidin-4-yl) adipate, bis(1-oxyl-2,2,6,6-tetramethylpiperidin-4-yl) n-butylmalonate, bis(1-oxyl-2,2,6,6-tetra-methylpiperidin-4-yl) phthalate, bis(1-oxyl-2,2,6,6-tetramethylpiperidin-4-yl) isophthalate, bis(1-oxyl-2,2,6,6-tetramethylpiperidin-4-yl) terephthalate, bis(1-oxyl-2,2,6,6-tetramethylpiperidin-4-yl) hexahydroterephthalate, N,N'-bis(1-oxyl-2,2,6,6-tetramethylpiperidin-4-yl)adipamide, N-(1-oxyl-2,2,6,6-tetramethylpiperidin-4-yl)caprolactam, N-(1-oxyl-2,2,6,6-tetramethylpiperi-din-4-yl)dodecylsuccinimide, 2,4,6-tris[N-butyl-N-(1-oxyl-2,2,6,6-tetramethylpiperidin-4-yl)]-s-triazine, 4,4'-ethylenebis(1-oxyl-2,2,6,6-tetramethylpiperazin-3-one), 2-oxyl-1,1,3,3-tetra-methyl-2-isobenzazole, 1-oxyl-2,2,5,5-tetramethylpyrrolidine, and N,N-bis-(1,1,3,3-tetra-methylbutyl)nitroxide.

Nitroxyl stabilizers are for example bis(1-oxyl-2,2,6,6-tetramethylpiperidin-4-yl) sebacate, 4-hydroxy-1-oxyl-2,2,6,6-tetramethylpiperidine, 4-ethoxy-1-oxyl-2,2,6,6-tetramethylpiperidine, 4-propoxy-1-oxyl-2,2,6,6-tetramethylpiperidine, 4-acetamido-1-oxyl-2,2,6,6-tetramethylpiperidine, 1-oxyl-2,2,6,6-tetramethylpiperidine, and 1-oxyl-2,2,6,6-tetramethylpiperidin-4-one.

A specific embodiment of the invention is a composition wherein the stabilizer is a sterically hindered nitroxyl compound, in particular a bis(1-oxyl-2,2,6,6-tetramethylpiperidin-4-yl) sebacate or 4-hydroxy-1-oxyl-2,2,6,6-tetramethylpiperidine.

Sterically hindered phenolic antioxidants are well known in the art and are described in the literature for example by Gaechter-Mueller in Plastic Additives, 3$^{rd}$ edition, page 40-44.

Examples are esters of beta-(3,5-di-tert-butyl-4-hydroxyphenyl)propionic acid with mono- or polyhydric alcohols or thiols.

Specific examples of sterically hindered phenols are pentaerythritoltetrakis[3-(3,5-di-t-butyl-4-hydroxyphenyl)propionate], thiodiethylenebis[3-(3,5-di-t-butyl-4-hydroxyphenyl)propionate], octadecyl-3-(3,5-di-t-butyl-4-hydroxyphenyl)propionate, N,N'-hexane-1,6-diylbis[3-(3,5-di-t-butyl-4-hydroxyphenyl)propionamide], isooctyl-3,5-bis(1,1-dimethylethyl)-4-hydroxybenzenepropionate, 2,4-dimethyl-6-(1-methylpentadecyl)phenol, diethyl[[3,5-bis(1,1-dimethylethyl)-4-hydroxyphenyl]methyl]phosphonate, 3,3'3",5,5'5"-hexa-t-butyl-a,a'a"-(mesitylene-2,4,6-triyl)tri-p-cresol-, calcium diethylbis[[[3,5-bis(1,1-dimethylethyl)-4-hydroxyphenyl]methyl]p-hosphonate], 4,6-bis(octylthiomethyl)-o-cresol, ethylenebis(oxyethylene)bis[3-(5-t-butyl-4-hydroxy-m-tolyl)-propionate], hexamethylenebis[3-(3,5-di-t-butyl-4-hydroxyphenyl)propionate], 1,3,5-tris(3,5-di-t-butyl-4-hydroxybenzyl)-1,3,5-triazine-2,4,6(1H,3H,5H)-trione, a reaction product of N-phenyl-benzeneamine and 2,4,4-trimethylpentene, 2,6-di-t-butyl-4-(4,6-bis(octylthio)-1,3,5-triazin-2-ylamino)phenol, bis(1,2,2,6,6-pentamethyl-4-piperidyl)[[3,5-bis(1,1-dimethylethyl)hydroxy-phenyl]butylmalonate, 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine and 4-benzoyloxy-2,2,6,6-tetra-methylpiperidine.

Examples of commercially available products of these compounds are IRGANOX® 1010, 1010FP, 1010FF, 1035, 1035FF, 1076, 1076FF, 1076FD, 1098, 1135, 1141, 1222, 1330, 1425WL, 1520L, 1520LR, 245, 245FF, 259, 3114, 5057, 565, 565FL (manufactured by Ciba Specialty Chemicals Co., Ltd.).

In a preferred embodiment of the invention in the composition as described above the phenolic antioxidant is selected from the group consisting of an ester of beta-(3,5-di-tert-butyl-4-hydroxyphenyl)propionic acid with a monohydric alcohol or a polyhydric alcohol or a thiol.

Examples of onium salt photoinitiators are iodonium salt compounds as for example disclosed in U.S. Pat. No. 6,306,555 and U.S. Pat. No. 6,235,807, the disclosures of which are hereby incorporated by reference.

Interesting are iodonium salt photoinitiators of the formula (I)

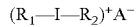

$(R_1—I—R_2)^+A^-$ (I), wherein $R_1$ and $R_2$ independently of one another are phenyl substituted by $C_1$-$C_{24}$alkyl or $C_1$-$C_{24}$alkoxy; and $A^-$ is an anion, for example selected from the group consisting of $SbF_6^-$, $PF_6^-$, $(B(C_6F_5))_4^-$ and sulfonate anions, such as for example tosylate, pentafluoroethylsulfonate, nonaflate, 4-methoxyphenylsulfonate, 4-chlorophenylsulfonate, 4-fluorophenylsulfonate, 2,4,6-trimethyl-phenylsulfonate, 2,4,6-(tri-isopropyl)-phenylsulfonate, 4-dodecylphenylsulfonate, camphor-10-sulfonate, 4-trifluoro-methylphenylsulfonate and nonafluorobutylsulfonate.

Illustrative examples of iodonium salt compounds are bis(4-hexylphenyl)iodonium hexafluoroantimonate; bis(4-hexylphenyl)iodonium hexafluoro-phosphate; (4-hexylphenyl)phenyliodonium hexafluoroantimonate; (4-hexylphenyl)phenyl-iodonium hexafluorophosphate; bis(4-octylphenyl)iodonium hexafluoroantimonate; (4-sec-butylphenyl)-(4'-methylphenyl)iodonium hexafluorophosphate; (4-iso-proylphenyl)-(4'-methylphenyl)iodonium hexafluorophosphate; [4-(2-hydroxytetradecyloxy)phenyl]phenyliodonium hexafluoroantimonate; [4-(2-hydroxydodecyloxy)phenyl]phenyliodonium hexafluoroantimo-nate; bis(4-octylphenyl)iodonium hexafluorophosphate; (4-octylphenyl)phenyliodonium hexa-fluoroantimonate; (4-octylphenyl)phenyliodonium hexafluorophosphate; bis(4-decylphenyl)-iodonium hexafluoroantimonate; bis(4-decylphenyl)iodonium hexafluorophosphate; (4-decylphenyl)phenyliodonium hexafluoroantimonate; (4-decylphenyl)phenyliodonium hexafluoro-phosphate; (4-octyloxyphenyl)phenyliodonium hexafluoroantimonate; (4-octyloxyphenyl)-phenyliodonium hexafluorophosphate; (2-hydroxydodecyloxyphenyl)phenyliodonium hexafluoroantimonate; (2-hydroxydodecyloxyphenyl)phenyliodonium hexafluorophosphate; bis(4-hexylphenyl)iodonium tetrafluoroborate; (4-hexylphenyl)phenyliodonium tetrafluoroborate; bis(4-octylphenyl)iodonium tetrafluoroborate; (4-octylphenyl)phenyliodonium tetrafluoro-borate; bis(4-decylphenyl)iodonium tetrafluoroborate; bis(4-(mixed $C_8$-$C_{14}$alkyl)phenyl)-iodonium hexafluoroantimonate; (4-decylphenyl)phenyliodonium tetrafluoroborate; (4-octyl-oxyphenyl)phenyliodonium tetrafluoroborate; (2-hydroxydodecyloxyphenyl)phenyliodonium tetrafluoroborate; biphenylene iodonium tetrafluoroborate; biphenylene iodonium hexa-fluorophosphate; biphenylene iodonium hexafluoroantimonate.

Other illustrative examples of iodonium photoinitiators are 4-isobutylphenyl-4'-methylphenyl-iodonium hexafluorophosphate; 4-isobutylphenyl-4'-methylphenyliodonium pentafluoroethyl-sulfonate; 4-isobutylphenyl-4'-methylphenyliodonium tosylate; 4-isobutylphenyl-4'-methylphenyliodonium nonaflate; 4-isobutylphenyl-4'-methylphenyliodonium tosylate; 4-isobutyl-phenyl-4'-methyl-phenyliodonium 4-methoxyphenylsulfonate; 4-isobutylphenyl-4'-methyl-phenyliodonium 4-chlorophenylsulfonate; 4-isobutylphenyl-4'-methylphenyliodonium 4-fluoro-phenylsulfonate; 4-isobutylphenyl-4'-methylphenyliodonium 2,4,6-trimethylphenylsulfonate; 4-isobutylphenyl-4'-methylphenyliodonium 2,4,6-(tri-isopropyl)-phenylsulfonate; 4-isobutylphenyl-4'-methyl-phenyliodonium 4-dodecylphenylsulfonate; 4-isobutylphenyl-4'-methylphenyl-iodonium camphor-10-sulfonate; 4-isobutylphenyl-4'-methylphenyliodonium tetrakis(penta-fluorophenyl)-borate; 4-isopropylphenyl-4'-methylphenyliodonium tetrakis(pentafluorophenyl)-borate; 4-(2-methylbut-2-yl)phenyl-4'-methylphenyliodonium hexafluorophosphate; 4-(2-methylbut-2-yl)phenyl-4'-methylphenyliodonium pentafluoroethylsulfonate; 4-(2-methylbut-2-yl)phenyl-4'-methylphenyliodonium tetrakis(pentafluorophenyl)borate; 4-(2-methylbut-2-yl)-phenyl-4'-methylphenyliodonium hexafluorophosphate; 4-(2-methylbut-2-yl)phenyl-4'-methyl-phenyliodonium pentafluoroethylsulfonate; 4-(2-methylbut-2-yl)phenyl-4'-methyl-phenyliodonium nonaflate; 4-(2-methylbut-2-yl)phenyl-4'-methylphenyliodonium 4-trifluoro-methylphenyl-sulfonate; 4-(2-methylbut-2-yl)phenyl-4'-methylphenyliodonium tosylate; 4-(2-methylbut-2-yl)-phenyl-4'-methylphenyliodonium camphor-10-sulfonate; 4-cyclohexyl-4'-methylphenyliodonium hexafluorophosphate; 4-cyclohexyl-4'-methylphenyliodonium penta-fluoroethylsulfonate; 4-cyclohexyl-4'-methylphenyliodonium camphor-10-sulfonate; 4-cyclohexyl-4'-methylphenyl-iodonium tetrakis(penta-fluorophenyl)borate; 4-cyclohexyl-4'-methyl-phenyliodonium tosylate; 4-tert-butylphenyl-4'-methylphenyliodonium hexafluorophosphate; 4-tert-butylphenyl-4'-methylphenyliodonium pentafluoroethylsulfonate; 4-tert-butylphenyl-4'-methylphenyliodonium camphor-10-sulfonate; 4-tert-butylphenyl-4'-methylphenyliodonium tetrakis(pentafluoro-phenyl)borate; 4-tert-butylphenyl-4'-methylphenyliodonium 4-chloro-phenylsulfonate; 4-tert-butylphenyl-4'-methylphenyliodonium 4-fluorophenylsulfonate; 4-tert-butylphenyl-4'-methyl-phenyliodonium 4-methoxyphenylsulf-onate; 4-tert-butylphenyl-4'-methylphenyliodonium hexafluorophosphate; 4-isobutylphenyl-4'-methylphenyliodonium nonafluorobutylsulfonate; 4-cyclohexyl-4'-methylphenyliodonium hexafluoroantimonate; 4-(2-methylbut-2-yl)phenyl-4'-methylphenyliodonium nonafluorobutylsulfonate; 4-isobutylphenyl-2'-methylphenyliodonium hexafluorophosphate; 4-isobutylphenyl-4'-ethylphenyl-iodonium hexafluorophosphate; and 4-(branched dodecyl)-4-methylphenyliodonium hexafluorophosphate.

Preferred are 4-isobutylphenyl-4'-methylphenyliodonium hexafluoro-phosphate and 4-iso-propylphenyl-4'-methylphenyliodonium tetrakis(pentafluorophenyl)-borate.

The preparation of the iodonium photoinitiator compounds is known to the skilled person and is described in the literature. A corresponding disclosure is for example to be found in U.S. Pat. No. 5,468,902, U.S. Pat. No. 4,399,071, U.S. Pat. No. 4,329,300 and U.S. Pat. No. 4,151,175, the disclosures of which hereby are incorporated by reference.

Further onium salt photoinitiators suitable in the context of the present invention are for example sulfonium salt compounds as disclosed for example in WO 03/008404 or WO 03/072567, the disclosures of which hereby are incorporated by reference.

Examples are compounds of the formula (III) or (IV)

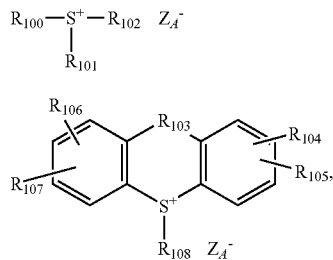

(III)

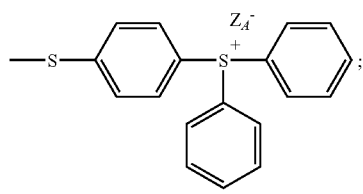

(IV)

wherein
$R_{100}$, $R_{101}$ and $R_{102}$ independently of one another are unsubstituted phenyl, or phenyl substituted by —S-phenyl or by

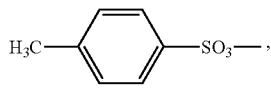

;

$R_{103}$ is a direct bond, S, O, $CH_2$, $(CH_2)_2$, CO or $NR_{109}$;
$R_{104}$, $R_{105}$, $R_{106}$ and $R_{107}$ independently of one another are H, $C_1$-$C_{20}$alkyl, $C_3$-$C_8$cycloalkyl, $C_1$-$C_{20}$alkoxy, $C_2$-$C_{20}$alkenyl, CN, OH, halogen, $C_1$-$C_6$alkylthio, phenyl, naphthyl, phenyl-$C_1$-$C_7$alkyl, naphtyl-$C_1$-$C_3$alkyl, phenoxy, naphthyloxy, phenyl-$C_1$-$C_7$alkyloxy, naphthyl-$C_1$-$C_3$alkyloxy, phenyl-$C_2$-$C_6$alkenyl, naphthyl-$C_2$-$C_4$alkenyl, S-phenyl, $(CO)R_{109}$, $O(CO)R_{109}$, $(CO)OR_{100}$, $SO_2R_{109}$ or $OSO_2R_{109}$;
$R_{108}$ is $C_1$-$C_{20}$alkyl, $C_1$-$C_{20}$hydroxyalkyl,

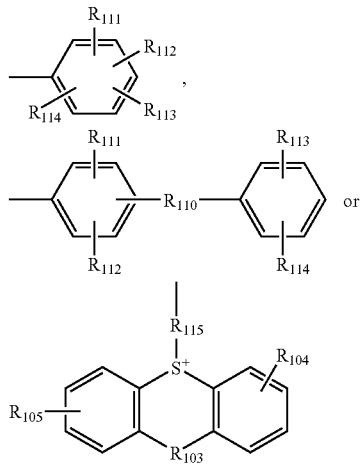

$R_{109}$ is H, $C_1$-$C_{12}$alkyl, $C_1$-$C_{12}$hydroxyalkyl, phenyl, naphthyl or biphenylyl;
$R_{110}$ is a direct bond, S, O or $CH_2$;
$R_{111}$, $R_{112}$, $R_{113}$ and $R_{114}$ independently of one another have one of the meanings as given for $R_{104}$;
or $R_{111}$ and $R_{113}$ are joined to form a fused ring system with the benzene rings to which they are attached;
$R_{115}$ is

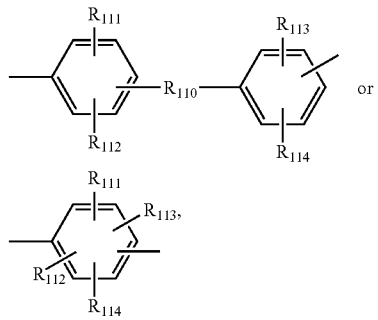

and
$Z_A$ is an anion, especially $PF_6$, $SbF_6$, $AsF_6$, $BF_4$, $(C_6F_5)_4B$, Cl, Br, $HSO_4$, $CF_3$—$SO_3$, F—$SO_3$,

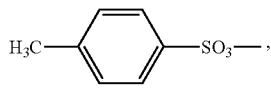

, $CH_3$—$SO_3$, $ClO_4$, $PO_4$, $NO_3$, $SO_4$, $CH_3$—$SO_4$ or

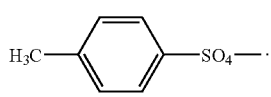

.

Specific sulfonium salts are obtainable, for example, under the trade names Cyracure® UVI-6990, Cyracure® UVI-6974

(The DOW Chemical Company), Degacure® KI 85 (Degussa), SP-55, SP-150, SP-170 (Asahi Denka), GE UVE 1014 (General Electric), SarCat®KI-85 (=triarylsulfonium hexafluorophosphate; Sartomer), SarCat® CD 1010 (=mixed triarylsulfonium hexafluoroantimonate; Sartomer); SarCat® CD 1011(=mixed triarylsulfonium hexafluoro-phosphate; Sartomer).

In the compositions and photoinitiator compositions of the invention a preferred onium salt photoinitiator is a iodonium salt compound, in particular 4-isobutylphenyl-4'-methylphenyl-iodonium hexafluoro-phosphate and 4-isopropylphenyl-4'-methylphenyliodonium tetrakis-(pentafluorophenyl)-borate.

The compositions or photoinitiator compositions according to the invention in particular comprise an onium salt photoinitiator of the formula (I), (III) or (IV)

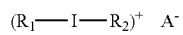 (I)

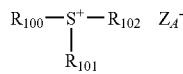 (I)

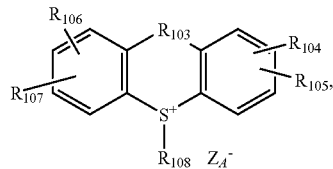 (IV)

wherein $R_1$ and $R_2$ independently of one another are phenyl substituted by $C_1$-$C_{24}$alkyl or $C_1$-$C_{24}$alkoxy;

$A^-$ is an anion;

$R_{100}$, $R_{101}$ and $R_{102}$ independently of one another are unsubstituted phenyl, or phenyl substituted by —S-phenyl or by

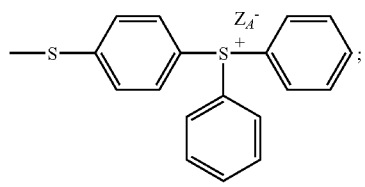

$R_{103}$ is a direct bond, S, O, $CH_2$, $(CH_2)_2$, CO or $NR_{109}$;

$R_{104}$, $R_{105}$, $R_{106}$ and $R_{107}$ independently of one another are H, $C_1$-$C_{20}$alkyl, $C_3$-$C_8$cycloalkyl, $C_1$-$C_{20}$alkoxy, $C_2$-$C_{20}$alkenyl, CN, OH, halogen, $C_1$-$C_6$alkylthio, phenyl, naphthyl, phenyl-$C_1$-$C_7$alkyl, naphtyl-$C_1$-$C_3$alkyl, phenoxy, naphthyloxy, phenyl-$C_1$-$C_7$alkyloxy, naphtyl-$C_1$-$C_3$alkyloxy, phenyl-$C_2$-$C_6$alkenyl, naphthyl-$C_2$-$C_4$alkenyl, S-phenyl, $(CO)R_{109}$, $O(CO)R_{109}$, $(CO)OR_{109}$, $SO_2R_{109}$ or $OSO_2R_{109}$;

$R_{108}$ is $C_1$-$C_{20}$alkyl, $C_1$-$C_{20}$hydroxyalkyl,

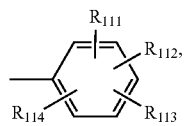

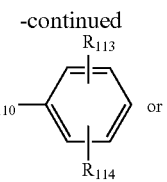

$R_{109}$ is H, $C_1$-$C_{12}$alkyl, $C_1$-$C_{12}$hydroxyalkyl, phenyl, naphthyl or biphenylyl;

$R_{110}$ is a direct bond, S, O or $CH_2$;

$R_{111}$, $R_{112}$, $R_{113}$ and $R_{114}$ independently of one another have one of the meanings as given for $R_{104}$;

or $R_{111}$ and $R_{113}$ are joined to form a fused ring system with the benzene rings to which they are attached;

$R_{115}$ is

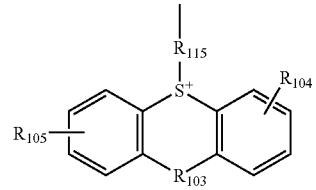

and $Z_A$ is an anion, especially $PF_6^-$, $SbF_6^-$, $AsF_6^-$, $BF_4^-$, $(C_6F_5)_4B$, Cl, Br, $HSO_4$, $CF_3$—$SO_3$, F—$SO_3$,

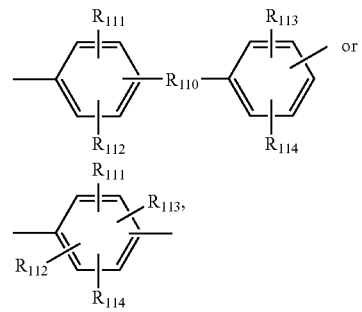

$CH_3$—$SO_3$, $ClO_4$, $PO_4$, $NO_3$, $SO_4$, $CH_3$—$SO_4$ or

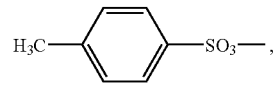

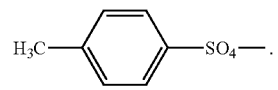

Preferred is are compositions as described above, wherein the onium salt photoinitiator is of the formula (I).

Preferred anions $A^-$ are $SbF_6^-$, $PF_6^-$ and $(B(C_6F_5))_4^-$.

The compositions according to the invention may comprise mixtures of one or more different onium salts, e.g. mixtures of one or more different iodonium salts, mixtures of one or more different sulphonium salts as well as mixtures of one or more different iodonium and sulphonium salts.

The content of moisture scavenger in the compositions of the present invention is for example from 0.01 wt % to 10 wt % or from 0.1 wt % to 10 wt %, preferably from 0.5 wt % to 10 wt %, especially from 0.1 wt % to 5 wt % or from 0.5 wt % to 5 wt %, based on the total composition.

(wt % refers to percent by weight)

The content of the stabilizers selected from the group consisting of sterically hindered nitroxyl stabilizers, sterically hindered phenolic antioxidants, organic phosphorous stabilizers and mixtures thereof in the compositions of the present invention is for example from $10^{-4}$ wt % to 2 wt %, preferably from $10^{-4}$ wt % to 1 wt %, especially from $10^{-4}$ wt % to 0.5 wt % or from $10^{-4}$ Wt % to 0.1 wt %.

The weight ratio of moisture scavenger to stabilizer is for example from 100-0.1 to 100-10.

In the compositions of this invention, the onium salt photoinitiators are for example present in an amount of from about 0.05% to about 15% by weight or from about 0.1% to about 10% by weight, preferably from about 0.5% to about 5% by weight, based on the weight of the composition.

The photocurable composition for example in addition is stabilized by a further stabilizer selected from hindered nitroxyl stabilizers, sterically hindered phenolic antioxidants and/or organic phosphorous stabilizers.

The mixtures of moisture scavenger and further stabilizers are for example prepared by first preparing a solution of 1-50 parts by weight of stabilizer in a water free solvent. After dissolution of the solid stabilizer the desired quantity 10-500 parts by weight of the zeolite is added while stirring. In the next step the solvent is evaporated at a temperature of 20-150° C. This process ensures a homogenous distribution of the stabilizers in the powder.

The solvent is for example butylacetate.

The moisture scavenger together with the stabilizers is employed to provide shelf life stability to a formulated cationically photocurable composition, or likewise, is added directly to an onium salt photoinitiator, and thereby provides shelf life stability to a subsequent formulated curable composition.

Accordingly, another subject of this invention is a cationic photoinitiator composition comprising
at least one onium salt photoinitiator;
at least a moisture scavenger; and
at least a stabilizer selected from the group consisting of sterically hindered nitroxyl stabilizers, sterically hindered phenolic antioxidants, organic phosphorous stabilizers and mixtures thereof.

Optionally sensitizers are present in the compositions of this invention. Examples are compounds of the aromatic hydrocarbon class, typically anthracene and its derivatives, of the group of the xanthones, benzophenones and the derivatives thereof, such as Michler's ketone, Mannich bases or bis(p-N,N-dimethylaminobenzylidene)acetone. Thioxanthone and the derivatives thereof are also suitable, typically isopropylthioxanthone; or dyes, such as acridines, triarylmethanes, e.g. malachite green, indolines, thiazines, e.g. methylene blue, oxazines, phenazines, typically safranine, or rhodamines. Aromatic carbonyl compounds are particularly suitable, such as benzophenone, thioxanthone, anthraquinone and 3-acyl-coumarine derivatives, and also 3-(aroylmethylene thiazolines, as well as eosine, rhodanine and erythrosine dyes.

Preferred sensitisers are those selected from the group consisting of the anthracenes, xan-thones, benzophenones and thioxanthones, preferably isopropylthioxanthone.

Sensitizers are present in the composition to be cured for example in an amount of from about 0.05 to about 10% by weight, e.g. from about 0.1 to 5% by weight, preferably from about 0.1 to 2% by weight, based on the weight of the composition.

The compositions according to the invention optionally additionally comprises further photoinitiators, such as, for example, cationic photoinitiators, photo acid formers in amounts of from 0.01 to 15% by weight, for example from 0.1 to 5% by weight, based on the weight of the composition.

Further, additional additives customary in the art may be present in the curable compositions of this invention. Such additives are added to the compositions in amounts customary in the art and generally known to the skilled person. Typical examples of such additives are light stabilizers, such as UV absorbers, typically those of the hydroxyphenylbenztriazole, hydroxyl-phenylbenzophenone, oxalic acid amide or hydroxyphenyl-s-triazine type.

Other customary additives include for example thermal inhibitors, optical brighteners, fillers and pigments, anti-corrosive pigments, conductive pigments, as well as white and colored pigments, dyes, antistatics, adhesion promoters, wetting agents, flow auxiliaries, lubricants, waxes, anti-adhesive agents, dispersants, emulsifiers, antioxidants, fillers, e.g. talcum, gypsum, silicic acid, rutile, carbon black, zinc oxide, iron oxides, reaction accelerators, thickeners, matting agents, antifoams, and other adjuvants customary, for example, in lacquer and coating technology.

The compositions according to the present invention may comprise dyes and/or white or colored pigments.

The compositions according to the present invention may also comprise thermally curable components.

The curable compositions according to the present invention may also comprise free-radically polymerizable components such as ethylenically unsaturated monomers, oligomers or polymers. Suitable materials contain at least one ethylenically unsaturated double bond and are capable of undergoing addition polymerization.

When free-radically polymerizable components are added to the compositions of this invention, it may be advantageous to add one or more suitable free-radical photoinitiator, for example benzophenone and derivatives thereof, acetophenone and derivatives thereof or mono- or bis-acylphosphine oxides.

Free-radically curable compounds and free-radical photoinitiators, which additionally may be used are for example disclosed in U.S. Pat. No. 6,306,555, the disclosure of which is incorporated herein by reference.

The compositions according to the invention can be used in numerous applications, for example for the preparation of surface coating compositions such as liquid industrial coatings, coil coatings, can coatings, powder coating compositions, printing inks, printing plates, dental compounds, stereolithography resins, adhesives, anti-adhesive coatings, color filters, resist materials or image-recording materials.

Subject of the invention therefore also is the use of the composition as described above for the preparation of a surface coating, a liquid industrial coating, a coil coating, a can coating, a powder coating, a printing ink, a printing plate, a dental composition, a stereolithography resin, an adhesive, an anti-adhesive coating, a color filter, a resist material or an image-recording material.

For the use of a formulation in the above indicated application, e.g in a coating, a sufficient shelf life stability of the formulation is crucial. A sufficient shelf life stability is for example characterized by a stable rheological profile, constant curing speed and dry film properties such as solvent resistance, adhesion, color stability and weathering stability.

It is further important for the composition to keep a constant viscosity prior to and during the application to the substrate and prior to the crosslinking in order to ensure a constant fluidity of the composition for the application of the coating.

Viscosity ranges of liquid coatings processed (produced or applied) at temperatures between 0° C. to 80° C. are for example from about 1 mPas to 20000 mPas, e.g. from 10 mPas to 12000 mPas, preferably from 10 mPas to 8000 mPas. Irrespective of the absolute value of the viscosity it is necessary to maintain the initial viscosity value of the composition, which is achieved in the composition of the present invention.

The layer thickness range generally includes values from about 0.1 µm to more than 100 µm, e.g. from 1 µm up to 500 µm, preferably from 0.5 micrometre to 50 micrometre.

Other relevant properties in coatings applications are for example gloss and haze of the cured coating. The presently claimed composition provides said good haze and gloss properties.

The coating of the substrates is for example effected by applying a liquid composition, a solution or suspension to the substrate.

In the process of curing the present compositions, ultraviolet (UV) irradiation is usually carried out with light having a wavelength in the range of 200 nm to 600 nm. Suitable radiation includes e.g. sun light or light from artificial light sources. Light sources to be used include a great number of a very wide range of types. Suitable light sources are point sources as well as arrays of reflector lamps (lamp carpets). Typical examples are: carbon arc lamps, xenon arc lamps, mercury (medium, high and low pressure) lamps, where desired doped with metal halides (metal halide lamps), microwave-excited metal vapor lamps, excimer lamps, superactinic neon lamps, fluorescent lamps, argon filament lamps, flash bulbs, photographic flood light lamps, Light emitting diodes (LED), electron beams and X-rays. The distance between the lamp and the substrate to be irradiated can vary depending on the end use requirement and type of lamp or lamp intensity, e.g. from about 2 cm to about 150 cm. Laser light sources are also suitable, e.g. excimer laser. It is also possible to use laser in the visible range.

The time of irradiation (exposure time) usually for example ranges from about half a second up to one or several minutes, e.g. 0.5 s to 60 s or 1 s to 20 s etc.

Normally the compositions according to the invention are dissolved in a suitable solvent prior to the application to the substrate. Examples of such solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, 2-ethoxyethyl acetate, 2-ethoxyethanol, diethyl glycol dimethyl ether, ethylene glycol mono-ethyl ether acetate, propylene glycol monomethyl ether, propylene glycol monomethyl ether acetate, toluene, ethyl acetate, methyl lactate, ethyl lactate, methylmethoxy propionate, ethylethoxy propionate, methyl pyruvate, ethyl pyruvate, propyl pyruvate, N,N-dimethyl-formamide, dimethyl sulfoxide, N-methylpyrrolidone and tetrahydrofuran. Such solvents can for example be used individually or in combinations. Preferred examples of solvents include esters, such as 2-methoxyethyl acetate, ethylene glycol monoethyl ether acetate, propylene glycol mono-methyl ether acetate, methylmethoxy propionate, ethylethoxy propionate and ethyl lactate.

Optionally a surfactant is added to the solvent. Examples of suitable surfactants are non-ionic surfactants, such as polyoxyethylene alkyl ethers, e.g. polyoxyethylene lauryl ether, polyoxyethylene stearyl ether, polyoxyethylene acetyl ether and polyoxyethylene oleyl ether; polyoxyethylene alkyl aryl ethers, e.g. polyoxyethylene octyl phenol ether and polyoxyethylene nonyl phenol ether; polyoxyethylene/polyoxypropylene block copolymers, sorbitol/-fatty acid esters, e.g. sorbitol monolaurate, sorbitol monopalmitate, sorbitol monostearate, sorbitol monooleate, sorbitol trioleate; fluorochemical surfactants, such as F-top EF301, EF303 and EF352 (New Akita Chemical Company, Japan), Megafac F171 and F17.3 (Dainippon Ink & Chemicals, Inc, Japan), Fluorad FC 430 and FC431 (Sumitomo #M Ltd., Japan), Asahi Guard AG710 and Surflon S-382, SC101, SC102, SC103, SC104, SC105 and SC106 (Asahi Grass Col, Ltd., Japan); organosiloxane polymer KP341 (Shin-Etsu Chemical Co., Ltd., Japan); and acrylic or methacrylic (co)polymers Poly-flow Now.75 and N0.95 (Kyoeisha Chemical Co., Ltd., Japan). Generally the proportion of surfactant in the composition is for example from about 2 parts by weight or less, e.g. 0.1 part by weight or less, per 100 parts by weight of solids content in the composition. The surfactants may be used individually or in combinations.

The solution of the composition according to the invention is applied uniformly to a substrate by means of generally known methods already described above. Suitable layer thicknesses have also already been indicated above.

The invention further is directed to a method for the photopolymerisation or crosslinking of a composition comprising at least one cationically polymerizable compound,
at least one onium salt photoinitiator,
at least a moisture scavenger, and
at least a stabilizer selected from the group consisting of sterically hindered nitroxyl stabilizers, sterically hindered phenolic antioxidants, organic phosphorous stabilizers and mixtures thereof, characterized in that the composition is subjected to radiation having a wavelength in the range of 200 nm to 600 nm; as well as to a method for the preparation of a surface coating, a liquid industrial coating, a coil coating, a can coating, a powder coating, a printing ink, a printing plate, a dental composition, a stereolithography resin, an adhesive, an anti-adhesive coating, a color filter, a resist material or an image-recording material.

Another object of the invention is a coated substrate that is coated on at least one surface with a composition as described above.

Throughout this specification and the claims which follow, unless the context requires otherwise, the word "comprise", or variations such as "comprises" or "comprising", will be understood to imply the inclusion of a stated integer or step or group of integers or steps but not the exclusion of any other integer or step or group of integers or steps.

The examples which follow illustrate the invention in more detail. Parts and percentages are, as in the remainder of the description and in the claims, by weight, unless stated otherwise.

The following compounds are employed in the working Examples.

Cationically Curable Components:

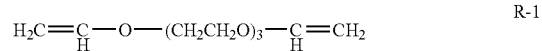

R-1

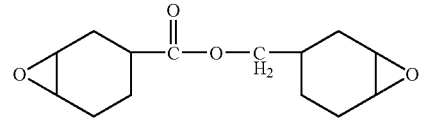

R-2

-continued

R-3
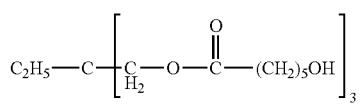

Photoinitiators:

PI-1
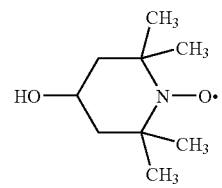

PI-2
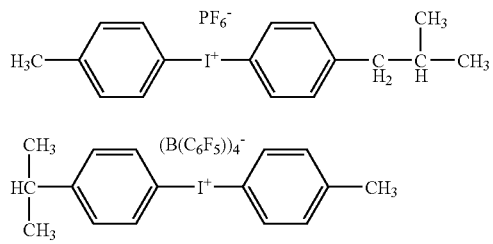

PI-3
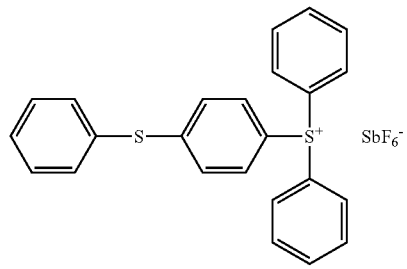

PI-4
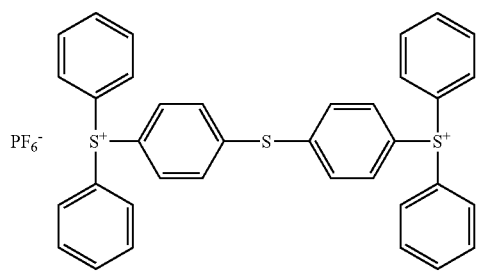

PI-5
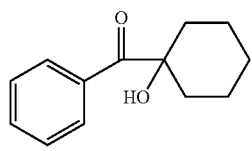

Photosensitizer:

PI-6
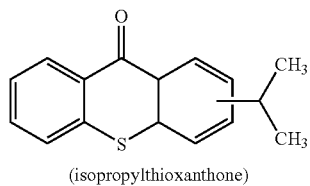
(isopropylthioxanthone)

Hindered Nitroxyl Stabilizers:

NO-1
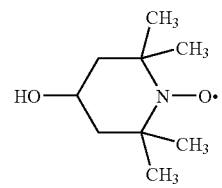

NO-2
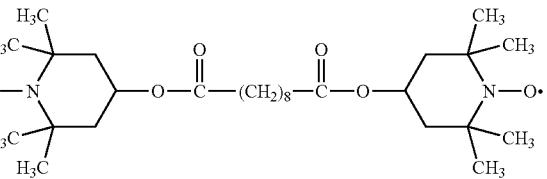

Sterically Hindered Phenolic Antioxidants:

AO-1
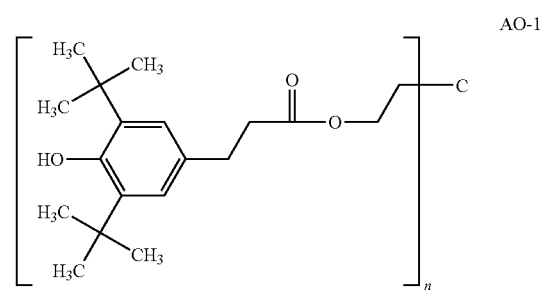
n = 4
IRGANOX® 1010 (Ciba Specialty Chemicals)

AO-2
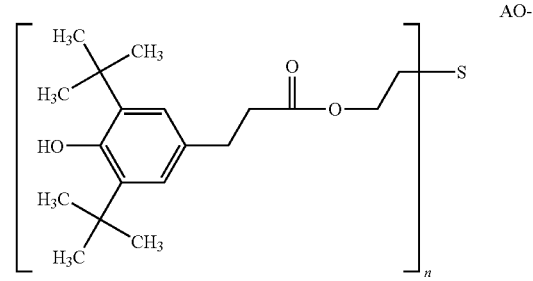
n = 2
IRGANOX® 1035 (Ciba Specialty Chemicals)

[PI-1, PI-5 and PI-6 are available from Ciba Specialty Chemicals under the tradenames IRGACURE® 250, IRGACURE® 184 and DAROCUR® ITX]

The preparation of the stabilizer mixture based on the zeolites and hindered nitroxyl stabilizers or sterically hindered phenolic antioxidants in the following examples 1 and 2 is done as follows:

The process is based on a ready made solution of 50 parts of an organic solvent (butylacetate) and 0.5 part of hindered nitroxyl stabilizers (or phenolic antioxidant respectively). 50 parts of zeolite are added under stirring after dissolution of the solid stabilizers. In the next step the solvent is evaporated at a temperature of 50° C. This process ensures a homogenous distribution of the stabilizers in the powder.

EXAMPLE 1

A photocurable composition is prepared with a 56.5:36.9 weight mixture of resins R-2:R-3 and 4 pph, by weight, of cationic photoinitiator PI-1. 2 pph by weight of free radical photoinitiator PI-5, 0.5 pph by weight of sensitizer PI-6 and 0.1 pph of Byk 306 (provided by Byk) as leveling agent.

The fresh composition exhibits a viscosity of 600 mPas. After a period of 84 days at 40° C., the unstabilized formulation exhibits a viscosity of 5000 mPas; the stabilized formulation with 2 pph based on a mixture of 99 parts of zeolite (SYLOSIV A 300 from Grace Davison) and 1 part of nitroxyl stabilizer NO-1 has a viscosity of 790 mPas, the stabilized formulation with 2 pph based on a mixture of 95 parts of zeolite and 5 parts of sterically hindered phenolic antioxidant AO-1 has a viscosity of 840 mPas, the stabilized formulation with 2 pph of zeolite has a viscosity of 1200 mPas. A review is given in the following table 1.

TABLE 1

| Sample - Stabilizer | Viscosity after 0 days | Viscosity after 84 days (40° C.) |
| --- | --- | --- |
| No stabilizer | 600 mPas | 5000 mPas |
| 2 pph (99% zeolite/1% nitroxyl stabilizer NO-1) | 600 mPas | 790 mPas |
| 2 pph (95% zeolite/5% phenolic antioxidant AO-1) | 600 mPas | 840 mPas |
| 2 pph zeolite | 600 mPas | 1200 mPas |
| 1.50 pph AO-1 | 600 mPas | 2730 mPas |

EXAMPLE 2

A photocurable composition is prepared with a 57.9:37.9 weight ratio of resins R-2:R-3 and 4.1 pph, by weight, of cationic photoinitiator PI-3 and 0.1 pph of a leveling agent.

The fresh composition exhibits a viscosity of 540 mPas.

After a period of 84 days at 40° C., the unstabilized formulation exhibits a viscosity of 3800 mPas; the stabilized formulation with 2 pph based on a mixture of 99 parts of zeolite and 1 part of nitroxyl stabilizer NO-1 has a viscosity of 660 mPas, the stabilized formulation with 2 pph of zeolite has a viscosity of 670 mPas. A review of the results is given in table 2

TABLE 2

| Sample - Stabilizer | Viscosity after 0 days | Viscosity after 84 days (40° C.) |
| --- | --- | --- |
| No stabilizer | 540 mPas | 3800 mPas |
| 2 pph (99% zeolite/1% nitroxyl stabilizer) | 540 mPas | 660 mPas |
| 2 pph zeolite | 540 mPas | 670 mPas |

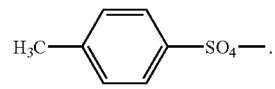

The invention claimed is:

1. A cationic photocurable composition comprising
   at least one cationically polymerizable compound,
   at least one onium salt photoinitiator,
   at least one moisture scavenger, and
   at least one stabilizer selected from the group consisting of sterically hindered nitroxyl stabilizers, sterically hindered phenolic antioxidants, organic phosphorous stabilizers and mixtures thereof;
   wherein the moisture scavenger is an activated substantially water free zeolite or triethylorthoformate, wherein the weight ratio of the moisture scavenger to the stabilizer is from 100-0.1 to 100-10.

2. A composition according to claim 1 wherein the stabilizer is a sterically hindered nitroxyl compound.

3. A composition according to claim 1 wherein the phenolic antioxidant is an ester of beta-(3,5-di-tert-butyl-4-hydroxyphenyl)propionic acid with a monohydric alcohol, a polyhydric alcohol or a thiol.

4. A composition according to claim 3 wherein the nitroxyl stabilizer is bis(1-oxyl-2,2,6,6tetramethylpiperidin-4-yl) sebacate or 4-hydroxy-1-oxyl-2,2,6,6-tetramethylpiperidine.

5. A composition according to claim 3, wherein the organic phosphorous stabilizer is selected from the group consisting of

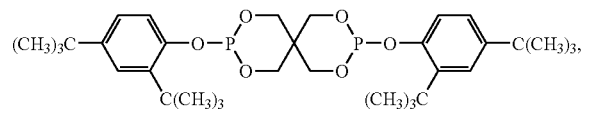

(OP1)

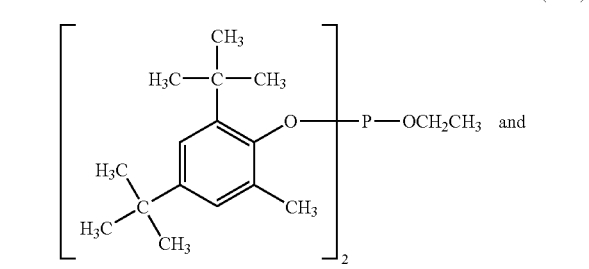

(OP2)

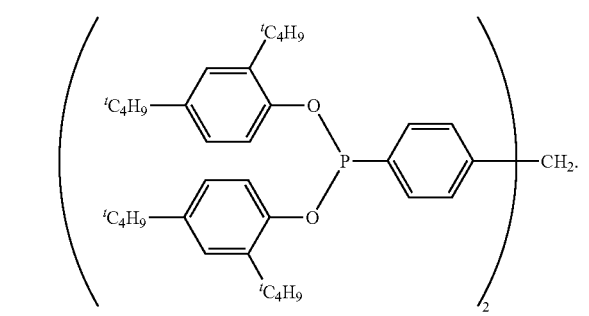

(OP3)

6. A composition according to claim 1, wherein the onium salt photoinitiator is of the formula (I), or (IV)

(I)

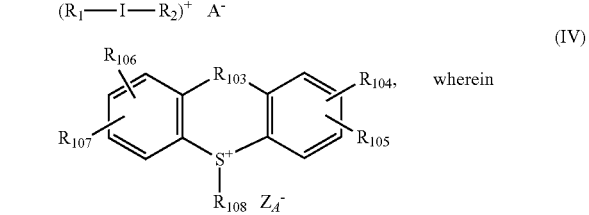

(IV)

wherein $R_1$ and $R_2$ independently of one another are phenyl substituted by $C_1$-$C_{24}$alkyl or $C_1$-$C_{24}$alkoxy;
$A^-$ is an anion;
$R_{103}$ is a direct bond, S, O, $CH_2$, $(CH_2)_2$, CO or $NR_{109}$;
$R_{104}$, $R_{105}$, $R_{106}$ and $R_{107}$ independently of one another are H, $C_1$-$C_{20}$alkyl, $C_3$-$C_8$cycloalkyl, $C_1$-$C_{20}$alkoxy, $C_2$-$C_{20}$alkenyl, CN, OH, halogen, $C_1$-$C_6$alkylthio, phenyl, naphthyl, phenyl-$C_1$-$C_7$alkyl, naphthyl-$C_1$-$C_3$alkyl, phenoxy, naphthyloxy, phenyl-$C_1$-$C_7$alkyloxy, naphthyl-$C_1$-$C_3$alkyloxy, phenyl-$C_2$-$C_6$alkenyl, naphthyl-$C_2$-$C_4$alkenyl, S-phenyl, (CO)$R_{109}$, O(CO)$R_{109}$, (CO)O$R_{109}$, $SO_2R_{109}$ or $OSO_2R_{109}$;

$R_{108}$ is $C_1$-$C_{20}$alkyl, $C_1$-$C_{20}$hydroxyalkyl,

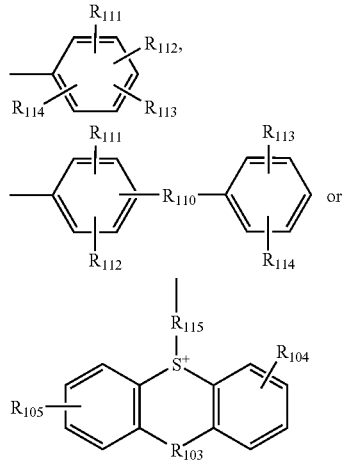

$R_{109}$ is H, $C_1$-$C_{12}$alkyl, $C_1$-$C_{12}$hydroxyalkyl, phenyl, naphthyl or biphenylyl;

$R_{110}$ is a direct bond, S, O or $CH_2$;

$R_{111}$, $R_{112}$, $R_{113}$ and $R_{114}$ independently of one another have one of the meanings as given for $R_{104}$;

or $R_{111}$ and $R_{113}$ are joined to form a fused ring system with the benzene rings to which they are attached;

$R_{115}$ is

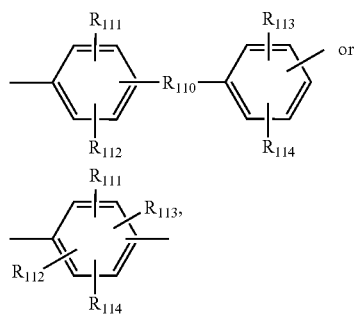

and $Z_A$ is an anion.

7. A composition according to claim 6, wherein the onium salt photoinitiator is of the formula (I).

8. A composition according to claim 1, wherein the content of moisture scavenger is from 0.01 to 20 wt. %.

9. A composition according to claim 1, wherein the content of the stabilizer is from $10^{-4}$ to 1 wt %, based on the total composition.

10. A cationic photoinitiator composition comprising
at least one onium salt photoinitiator;
at least one moisture scavenger; and
at least one stabilizer selected from the group consisting of sterically hindered nitroxyl stabilizers, sterically hindered phenolic antioxidants, organic phosphorous stabilizers and mixtures thereof;
wherein the moisture scavenger is an activated substantially water free zeolite or triethylorthoformate,
wherein the weight ratio of the moisture scavenger to the stabilizer is from 100-0.1 to 100-10.

11. A method for the photopolymerisation or crosslinking of a composition comprising
at least one cationically polymerizable compound,
at least one onium salt photoinitiator,
at least one moisture scavenger, and
at least one stabilizer selected from the group consisting of sterically hindered nitroxyl stabilizers, sterically hindered phenolic antioxidants, organic phosphorous stabilizers and mixtures thereof,
characterized in that the composition is subjected to radiation having a wavelength in the range of 200 nm to 600 nm;
wherein the moisture scavenger is an activated substantially water free zeolite or triethylorthoformate,
wherein the weight ratio of the moisture scavenger to the stabilizer is from 100-0.1 to 100-10.

12. A surface coating, a liquid industrial coating, a coil coating, a can coating, a powder coating, a printing ink, a printing plate, a dental composition, a stereolithography resin, an adhesive, an anti-adhesive coating, a color filter, a resist material or an image-recording material comprising a composition according to claim 1.

13. A method according to claim 11 for the preparation of a surface coating, a liquid industrial coating, a coil coating, a can coating, a powder coating, a printing ink, a printing plate, a dental composition, a stereolithography resin, an adhesive, an anti-adhesive coating, a color filter, a resist material or an image-recording material.

14. A coated substrate that is coated on at least one surface with a composition according to claim 1.

15. A composition according to claim 6, wherein $Z_A$ is selected from the group consisting of $PF_6$, $SbF_6$, $AsF_6$, $BF_4$, $(C_6F_5)_4B$, Cl, Br, $HSO_4$, $CF_3$—$SO_3$, F—$SO_3$,

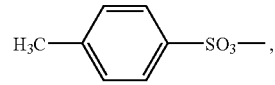

$CH_3$—$SO_3$, $ClO_4$, $PO_4$, $NO_3$, $SO_4$, $CH_3$—$SO_4$ and